(12) United States Patent
Khandelwal et al.

(10) Patent No.: US 10,988,490 B1
(45) Date of Patent: Apr. 27, 2021

(54) TRIIODOSILYLAMINE PRECURSOR COMPOUNDS

(71) Applicant: ENTEGRIS, INC., Billerica, MA (US)

(72) Inventors: Manish Khandelwal, Danbury, CT (US); David Kuiper, Brookfield, CT (US); Thomas H. Baum, New Fairfield, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 16/592,478

(22) Filed: Oct. 3, 2019

(51) Int. Cl.
 *C07F 7/00* (2006.01)
 *C07F 7/02* (2006.01)
 *H01L 21/02* (2006.01)

(52) U.S. Cl.
 CPC ........ *C07F 7/025* (2013.01); *H01L 21/02219* (2013.01); *H01L 21/0228* (2013.01)

(58) Field of Classification Search
 CPC . C07F 7/025; H01L 21/02219; H01L 21/0228
 See application file for complete search history.

(56) References Cited

U.S. PATENT DOCUMENTS

| | | | | |
|---|---|---|---|---|
| 9,564,309 B2* | 2/2017 | Niskanen | ............ | H01L 21/0217 |
| 9,701,695 B1* | 7/2017 | Kuchenbeiser | ......... | C07F 7/123 |
| 9,777,373 B2* | 10/2017 | Kuchenbeiser | ... | C23C 16/45553 |
| 9,824,881 B2* | 11/2017 | Niskanen | .......... | H01L 29/66795 |
| 9,905,416 B2* | 2/2018 | Niskanen | ............ | H01L 21/0217 |
| 10,395,917 B2* | 8/2019 | Niskanen | .......... | H01L 21/02274 |
| 2010/0041243 A1 | 2/2010 | Cheng | | |
| 2014/0273477 A1* | 9/2014 | Niskanen | .......... | H01L 21/02211 438/703 |
| 2014/0273528 A1* | 9/2014 | Niskanen | .......... | H01L 21/02211 438/792 |
| 2014/0273531 A1* | 9/2014 | Niskanen | ............ | H01L 21/0217 438/793 |
| 2016/0115593 A1* | 4/2016 | Kuchenbeiser | ... | H01L 21/02274 216/99 |
| 2017/0133216 A1* | 5/2017 | Niskanen | .......... | H01L 21/02274 |
| 2018/0366314 A1* | 12/2018 | Niskanen | .......... | H01L 21/02274 |
| 2019/0218238 A1 | 7/2019 | Baum | | |
| 2019/0371594 A1* | 12/2019 | Niskanen | .......... | H01L 21/02211 |
| 2020/0266048 A1* | 8/2020 | Wang | ................ | H01L 21/02208 |

OTHER PUBLICATIONS

Cass, R. et al., "438. Dimethylaminochlorosilanes", Journal of the Chemical Society, 1952, pp. 2347-2349. Abstract Only.

* cited by examiner

*Primary Examiner* — Alexander R Pagano
(74) *Attorney, Agent, or Firm* — Entegris, Inc.

(57) ABSTRACT

Provided are certain amino triiodosilanes useful as silicon precursor compounds for the vapor deposition of silicon species onto the surfaces of microelectronic devices. In this regard, such precursors can be utilized, along with optional co-reactants, to deposit silicon-containing films such as silicon nitride, silicon oxide, silicon oxynitride, SiOCN, SiCN, and silicon carbide. The silicon precursors of the invention are free of Si—H bonds. Also provided is a process for preparing such silicon precursor compounds by the displacement of a halogen from tetrahalosilane compounds with secondary amines.

12 Claims, 3 Drawing Sheets

TRIIODOSILYLAMINE PRECURSOR COMPOUNDS

FIELD OF THE INVENTION

This invention relates to the field of chemistry. In particular, it relates to methodology for the preparation of certain triiodosilyl amine compounds and their use as silicon precursor compounds in the manufacture of microelectronic devices.

BACKGROUND OF THE INVENTION

Low temperature deposition of silicon-based thin-films is of fundamental importance to current semiconductor device fabrication and processes. For the last several decades, $SiO_2$ thin films have been utilized as essential structural components of integrated circuits (ICs), including microprocessor, logic and memory based devices. $SiO_2$ has been a predominant material in the semiconductor industry and has been employed as an insulating dielectric material for virtually all silicon-based devices that have been commercialized. $SiO_2$ has been used as an interconnect dielectric, a capacitor and a gate dielectric material over the years.

The conventional industry approach for depositing high-purity $SiO_2$ films has been to utilize tetraethylorthosilicate (TEOS) as a thin-film precursor for vapor deposition of such films. TEOS is a stable, liquid material that has been employed as a silicon source reagent in chemical vapor deposition (CVD), plasma-enhanced chemical vapor deposition (PECVD) and atomic layer deposition (ALD), to achieve high-purity thin-films of $SiO_2$. Other thin-film deposition methods (e.g., focused ion beam, electron beam and other energetic means for forming thin-films) can also be carried out with this silicon source reagent.

As integrated circuit device dimensions continually decrease, with corresponding advances in lithography scaling methods and shrinkage of device geometries, new deposition materials and processes are correspondingly being sought for forming high integrity $SiO_2$ thin films. Improved silicon-based precursors (and co-reactants) are desired to form $SiO_2$ films, as well as other silicon-containing thin films, e.g., $Si_3N_4$, SiC, and doped $SiO_x$ high k thin films, that can be deposited at low temperatures, such as temperatures below 400° C. and below 200° C. To achieve these low deposition temperatures, chemical precursors are required to decompose cleanly to yield the desired films.

The achievement of low temperature films also requires the use and development of deposition processes that ensure the formation of homogeneous conformal silicon-containing films. Chemical vapor deposition (CVD) and atomic layer deposition (ALD) processes are therefore being refined and implemented, concurrently with the ongoing search for reactive precursor compounds that are stable in handling, vaporization and transport to the reactor, but exhibit the ability to decompose cleanly at low temperatures to form the desired thin films. The fundamental challenge in this effort is to achieve a balance of precursor thermal stability and precursor suitability for high-purity, low temperature film growth processes, while maintaining the desired electronic and mechanical properties of the films thus produced.

SUMMARY OF THE INVENTION

Figure 1:
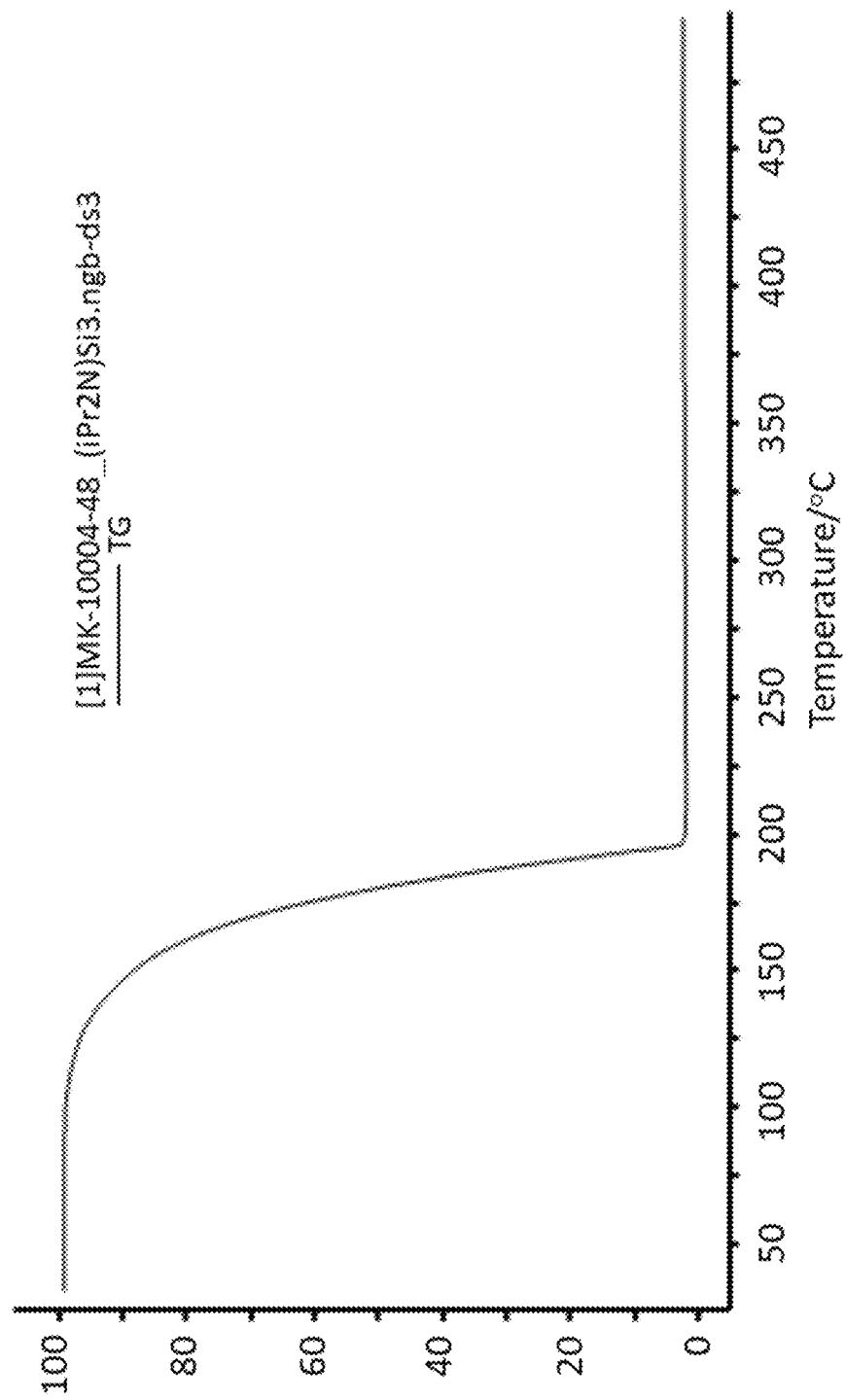
FIG. 1 is a Thermal Gravimetric Analysis and Differential Scanning Calorimetry spectra of diisopropylaminotriiodosilane.

In general, the invention provides certain amino triiodosilanes useful as silicon precursor compounds for the vapor deposition of silicon species onto the surfaces of microelectronic devices. In this regard, such precursors can be utilized, along with optional co-reactants, to deposit silicon-containing films such as silicon nitride, silicon oxide, silicon oxynitride, SiOCN, SiCN, and silicon carbide. The silicon precursors of the invention are free of Si—H bonds. Also provided is a process for preparing such silicon precursor compounds by the displacement of a halogen from tetrahalosilane compounds with secondary amines.

DETAILED DESCRIPTION OF THE INVENTION

In a first aspect, the invention provides a process for preparing compound of the formula $(R_2N)SiI_3$, wherein each R is the same or different and is a $C_1$-$C_6$ alkyl group, or each R is taken together with the nitrogen atom to which they are bonded to form a 3 to 6 membered N-heterocyclic ring, which comprises contacting a molar excess of a compound of the formula $R_2N$ with a tetrahalosilane. In certain embodiments, the tetrahalosilane is tetraiodosilane. In the practice of this aspect of the invention, the amine of the formula $R_2NH$ is added to the tetrahalosilane; further, the amine is utilized in a molar excess, which also serves as an acid scavenger (i.e., for HI). In one embodiment a ratio of tetrahalosilane to amine of about 1:2 to about 1:4, or about 1:2 is utilized. The amine of the formula $R_2N$ can be added to the tetrahalosilane compound neat or in an inert solvent, such as a hydrocarbon solvent; similarly, the tetrahalosilane compound can be utilized neat or in an inert solvent such as toluene or a hydrocarbon such as xylene. Further exemplary solvents include dichlormethane, chloroform, dichloroethane, carbon tetrachloride, pentane, hexane, cyclohexane, heptane, benzene, and the like.

The operational temperature range can in certain embodiments be from about −80° C. to about 100° C., or about −10° C. to about 25° C., or about 5° C. to about 10° C.

In certain embodiments, R is chosen from methyl, isopropyl, and t-butyl.

In certain embodiments, when each R is taken together with the atoms to which they are bonded to form a 3 to 6 membered N-heterocyclic ring, such compounds have the formulae

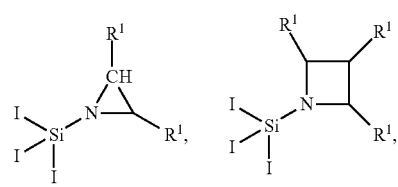

-continued

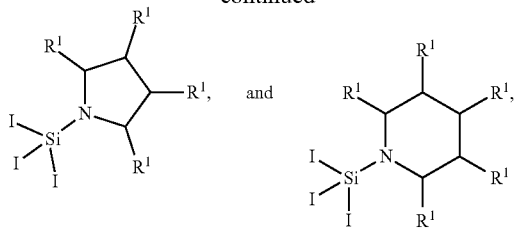

wherein each $R^1$ is the same or different and is chosen from hydrogen, $C_1$-$C_{10}$ alkyl, $C_3$-$C_8$ cycloalkyl, aryl, or heteroaryl.

As used herein, the term "aryl" includes phenyl and napthyl and such groups substituted with one to three groups chosen from $C_1$-$C_6$ alkyl, $C_1$-$C_6$ alkoxy, —CN, —NO$_2$, $C_1$-$C_6$ alkoxycarbonyl, $C_1$-$C_6$ alkanoyloxy, $C_1$-$C_6$ alkylsulfonyl, hydroxyl, carboxyl, and halogen.

The term "heteroaryl" includes 5 or 6-membered heterocyclic aryl rings containing one oxygen atom, and/or one sulfur atom, and up to three nitrogen atoms, said heterocyclic aryl ring optionally fused to one or two phenyl rings. Examples of such systems include thienyl, furyl, pyrrolyl, imidazolyl, pyrazolyl, thiazolyl, isothiazolyl, oxazolyl, isoxazolyl, triazolyl, thiadiazolyl, oxadiazolyl, tetrazolyl, thiatriazolyl, oxatriazolyl, pyridyl, pyrimidyl, pyrazinyl, pyridazinyl, thiazinyl, oxazinyl, triazinyl, thiadiazinyl, oxadiazinyl, dithiazinyl, dioxazinyl, oxathiazinyl, tetrazinyl, thiatriazinyl, oxatriazinyl, dithiadiazinyl, imidazolinyl, dihydropyrimidyl, tetrahydropyrimidyl, tetrazolo-[1,5-b]pyridazinyl and purinyl, benzoxazolyl, benzothiazolyl, benzimidazolyl, indolyl and the like, such groups are optionally substituted with one to three groups selected from $C_1$-$C_6$-alkyl, $C_1$-$C_6$ alkoxy, —CN, —NO$_2$, $C_1$-$C_6$ alkoxycarbonyl, $C_1$-$C_6$-alkanoyloxy, $C_1$-$C_6$ alkylsulfonyl, and halogen groups.

In a second aspect, the invention provides a compound of the formula $(R_2N)SiI_3$, wherein each R is independently a $C_1$-$C_6$ alkyl group. In certain embodiments, R is chosen from methyl, ethyl, propyl, n-butyl, isopropyl, t-butyl, and sec-butyl. In certain embodiments, the compound of the formula $(R_2N)SiI_3$ is chosen from diiospropylamino triiodosilane, diethylamino triiodosilane, and dimethylamino triiodosilane.

In a third aspect, the invention provides compounds of the formulae

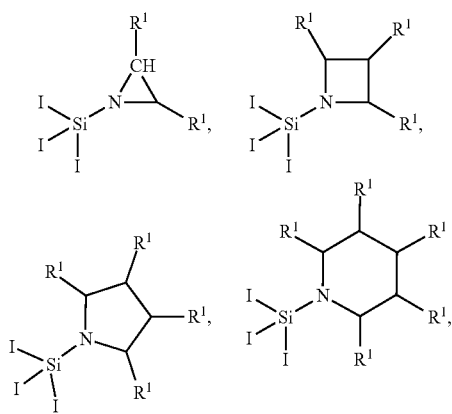

wherein each $R^1$ is the same or different and is chosen from hydrogen, $C_1$-$C_{10}$ alkyl, $C_3$-$C_8$ cycloalkyl, aryl, or heteroaryl.

In these second and third aspects, the compounds recited are useful as precursor compounds for the deposition of silicon onto the surface of a microelectronic device.

Upon suitable completion of the reaction, the crude product may be filtered through compatible filter media which can be composed of materials including glass, thermally activated diatomaceous earth, polypropylene, polyethylene, polytetrafluoroethylene (PTFE), perfluoroalkoxy alkanes (PFA), passivated stainless steel and nickel alloys thereof. The solvent separation from the filtrate can be accomplished by bulb-to-bulb distillation at a pressure ranging from 0.01 to 760 Torr and a temperature ranging from 20° C. to 110° C. Additional purification steps may include a short path vacuum distillation to separate the desired product from the mixture of di- or tri-substituted side products, the residual solvents, and any halosilane complexes formed in the course of the reaction, with the product purity from a short path distillation ranging from 95%-99%. Additional purification steps include the use of a fractional distillation under atmospheric pressure or vacuum conditions to achieve purities in excess of 99%. In certain embodiments, the purification may also include crystallization or solvent washings to achieve electronic grade purity in excess of 99%.

As noted above, the compounds of the formula $(R_2N)SiI_3$ are useful as precursor compounds for the low temperature vapor deposition of silicon onto at least one surface of a microelectronic device. Accordingly, in a third aspect, the invention provides a process for depositing silicon-containing film on a microelectronic device substrate, which comprises contacting said substrate with sequentially pulsed compound of the formula $(R_2N)SiI_3$, and optionally any desired co-reactants, at a temperature of about 150° C. to about 400° C., and at a pressure of about 0.5 to about 15 Torr, under atomic layer deposition conditions.

For ease of reference, "microelectronic device" includes semiconductor substrates, flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" is not meant to be limiting in any way and includes any substrate that will eventually become a microelectronic device or microelectronic assembly.

In general, vapor deposition conditions comprise reaction conditions known as chemical vapor deposition, pulse-chemical vapor deposition, and atomic layer deposition. In the case of pulse-chemical vapor deposition, a series of alternating pulses of precursor compound of the and any desired co-reactant(s), either with or without an intermediate (inert gas) purge step, can be utilized to build up the film thickness to a desired endpoint.

In certain embodiments, the pulse time (i.e., duration of exposure to the substrate) for the precursor compounds $(R_2N)SiI_3$ ranges between about 1 and 10 seconds. When a purge step is utilized, the duration is from about 1 to 4 seconds or 1 to 2 seconds. In other embodiments, the pulse time for the co-reactant ranges from 1 to 60 seconds. in other embodiments, the pulse time for the co-reactant ranges from about 5 to about 10 seconds.

In the method of the invention, the compound of the formula $(R_2N)SiI_3$ is reacted with the desired co-reactant in any suitable manner, for example, in a single wafer CVD chamber, or in a furnace containing multiple wafers. If the desired silicon-containing film is a silicon nitride, the co-reactant may be chosen from $N_2$, $H_2$, $NH_3$, hydrazines (such as $N_2H_4$, $CH_3HNNH_2$, $CH_3HNNHCH_3$), organic amines (such as $NCH_3H_2$, $NCH_3CH_2H_2$, $N(CH_3)_2H$, $N(CH_3CH_2)_2H$, $N(CH_3)_3$, $N(CH_3CH_2)_3$, $(Si(CH_3)_2NH)$, pyrazoline, pyridine, diamines (such as ethylene diamine), radical species thereof, and mixtures thereof. If the desired silicon-containing film is a silicon oxide, the co-reactant will be chosen from compounds such as $O_2$, $O_3$, $H_2O$, $H_2O_2$, NO, $N_2O$, $NO_2$, a carboxylic acid, an alcohol, a diol, and radicals thereof, and combinations thereof, the reactant being plasma treated oxygen.

In the case of atomic layer deposition (ALD) methodology, the compound of the formula $(R_2N)SiI_3$ can be utilized as one "silicon" precursor, and in the case of a desired silicon-nitride film, may utilize a nitrogen-containing material as a co-reactant or as another precursor. The nitrogen-containing material may be organic (for instance, t-butyl hydrazine), or inorganic (for instance, $NH_3$). In some embodiments, a mixture of nitrogen-containing materials may be utilized as precursor for the ALD, and in other embodiments only one nitrogen-containing material may be utilized as precursor for the ALD (for instance, only $NH_3$, or only t-butyl hydrazine). As used herein, the term "a nitrogen-containing material" may be utilized to refer to a precursor material which is pure (for instance, which is entirely $NH_3$ or entirely t-butyl hydrazine), or may refer to a precursor which contains "a nitrogen-containing material" as part of a mixture of nitrogen-containing materials. In certain embodiments, ALD may be used to form material comprising silicon and nitrogen. Such material may comprise, consist essentially of, or consist of silicon nitride, and/or may have other compositions.

In atomic layer deposition, sequential processing steps are generally referred to as "pulses" or cycles. As such, ALD processes are based on controlled, self-limiting surface reactions of precursor chemicals. Gas phase reactions are avoided by alternately and sequentially contacting the substrate with the precursors. Vapor phase reactants are separated from each other in time and on the substrate surface, for example, by removing excess reactants and/or reactant by-products from the reaction chamber between reactant pulses. In some embodiments, one or more substrate surfaces are alternately and sequentially contacted with two or more vapor phase precursors, or reactants. Contacting a substrate surface with a vapor-phase reactant means that the reactant vapor is in contact with the substrate surface for a limited period of time. In other words, it can be understood that the substrate surface is exposed to each vapor phase reactant for a limited period of time.

Briefly, a substrate comprising at least one surface is heated to a suitable deposition temperature ranging from 150° C. to 700° C., generally at pressures of from about 0.5 to 50 torr. In other embodiments, the temperature is from about 200° C. to 300° C. or 500° to 650° C. Deposition temperatures are generally maintained below the thermal decomposition temperature of the reactants but at a high enough temperature to avoid condensation of reactants and to provide the activation energy for the desired "selective" surface reactions. Exemplary surfaces include nitrides such as silicon, titanium, and aluminum nitrides, oxides such as silicon dioxide, hafnium oxide, and zirconium oxide.

The surface of the substrate is contacted with a vapor phase first reactant. In certain embodiments, a pulse of vapor phase first reactant is provided to a reaction space containing the substrate. In other embodiments, the substrate is moved to a reaction space containing vapor phase first reactant. Conditions are generally selected such that no more than about one monolayer of the first reactant is adsorbed on the substrate surface in a self-limiting manner. The appropriate contacting times can be readily determined by the skilled artisan based on the particular conditions, substrates and reactor configurations. Excess first reactant and reaction by-products, if any, are removed from the substrate surface, such as by purging with an inert gas or by removing the substrate from the presence of the first reactant.

Purging means that vapor phase precursors and/or vapor phase by-products are removed from the substrate surface such as by evacuating a chamber with a vacuum pump and/or by replacing the gas inside a reactor with an inert gas such as argon or nitrogen. In certain embodiments, purging times are from about 0.05 to 20 seconds, between about 1 and 10, or between about 1 and 2 seconds. However, other purge times can be utilized if necessary, such as where highly conformal step coverage over extremely high aspect ratio structures or other structures with complex surface morphology is needed.

The surface of the substrate is contacted with a vapor phase second gaseous reactant. In certain embodiments a pulse of a second gaseous reactant is provided to a reaction space containing the substrate. In other embodiments the substrate is moved to a reaction space containing the vapor phase second reactant. Excess second reactant and gaseous by-products of the surface reaction, if any, are removed from the substrate surface. The steps of contacting and removing are repeated until a thin film of the desired thickness has been selectively formed on the first surface of substrate, with each cycle leaving no more than about a molecular monolayer. Additional phases comprising alternately and sequentially contacting the surface of a substrate with other reactants can be included to form more complicated materials, such as ternary materials.

Each phase of each cycle is generally self-limiting. An excess of reactant precursors is supplied in each phase to saturate the susceptible structure surfaces. Surface saturation ensures reactant occupation of all available reactive sites (subject, for example, to physical size or "steric hindrance" restraints) and thus ensures excellent step coverage. Typically, less than one molecular layer of material is deposited with each cycle, however, in some embodiments more than one molecular layer is deposited during the cycle.

Removing excess reactants can include evacuating some of the contents of a reaction space and/or purging a reaction space with helium, nitrogen or another inert gas. In certain embodiments, purging can comprise turning off the flow of the reactive gas while continuing to flow an inert carrier gas to the reaction space. In another embodiment, the purge step may employ a vacuum step to remove excess reactant from the surface.

Reactors capable of being used to grow thin films can be used for the deposition described herein. Such reactors include ALD reactors, as well as CVD reactors equipped with appropriate equipment and means for providing the precursors in a "pulsed" manner. According to certain embodiments, a showerhead reactor may be used.

Examples of suitable reactors that may be used include commercially available equipment, as well as home-built reactors, and will be known to those skilled in the art of CVD and/or ALD.

Accordingly, in a fourth aspect, the invention provides a process for depositing a silicon-containing film on a microelectronic device substrate, which comprises contacting said substrate with a sequentially pulsed compound of Formula (I):

$$(R_2N)SiI_3, \quad (1)$$

wherein each R is the same or different and is a $C_1$-$C_6$ alkyl group, or each R is taken together with the nitrogen atom to which they are bonded to form a 3 to 6 membered N-heterocyclic ring;

and optionally any desired co-reactants, at a temperature of about 150° C. to about 700° C., and at a pressure of about 0.5 to about 50 Torr, under atomic layer deposition conditions.

This invention can be further illustrated by the following examples of certain embodiments thereof, although it will be understood that these examples are included merely for purposes of illustration and are not intended to limit the scope of the invention unless otherwise specifically indicated.

EXAMPLES

Example 1 (Diisopropylamino)triiodosilane

A 250 mL three neck round bottom flask equipped with a mechanical stirrer, a thermocouple and a rubber septum was charged with a solution of $SiI_4$ (10 g, 18.6 mmol) in toluene (50 mL). The solution was cooled to ~0° C. using an ice-bath. A solution of diisopropylamine (5.5 g, 74.4 mmol) in toluene (50 mL) was added dropwise to the chilled solution at 0-2° C. using a cannula. No immediate reaction was observed and after stirring for additional 30 min small amount of salt precipitated out. The mixture was allowed to stir overnight at room temperature. At this point more salt precipitated out indicating a slow progress of reaction. The mixture was analyzed by NMR. Only 10% conversion was observed, large amount of unreacted amine was also observed. The product was confirmed by GC MS analysis. Unreacted SiI4 was also observed. No further purification was attempted.

Example 2 (Diisopropylamino)triiodosilane

A 250 mL three neck round bottom flask equipped with a mechanical stirrer, a thermocouple and a rubber septum was charged with a solution of SiI4 (5 g, 9.33 mmol) in toluene (50 mL). The solution was cooled to ~0° C. using an ice-bath. A solution of diisopropylamine (1.88 g, 18.6 mmol) in toluene (50 mL) was added dropwise to the chilled solution at 0-2° C. using a cannula. No immediate reaction was observed and after stirring for additional 30 min small amount of salt precipitated out. The mixture was allowed to stir overnight at room temperature. At this point more salt precipitated out indicating a slow progress of reaction. The mixture was analyzed by NMR. No free amine was observed. The reaction mixture was filtered and stored as a solution in toluene. NMR analysis confirmed the formation of the desired product.

Example 3 (Diisopropylamino)triiodosilane

First batch of $(isopropyl)_2NSiI_3$ with 50 g $SiI_4$ in toluene (500 mL). Diisopropylamine (19 g) in toluene (50 mL) added dropwise to the pink $SiI_4$ solution at ~0 C. The color of the solution changed to straw like yellow and slowly became colorless. The reaction mixture turned cloudy but no significant exotherm was observed. Allowing the reaction mixture to stir at room temperature under nitrogen. The reaction was monitored by 1H NMR. After overnight stirring (~20 h) around 22% free amine was still unreacted and 95% of DIPA was consumed in 3 days at RT. The reaction mixture was filtered, volatiles were removed under reduced pressure resulting in a viscous oil. After overnight standing the viscous oil solidified. The solids were washed with chilled hexanes and dried under vacuum to obtain beige solid.

Yield 34 g (72%). Purity by $^1$H NMR >98%

Example 4 (Diethylamino)triiodosilane

Figure 2:
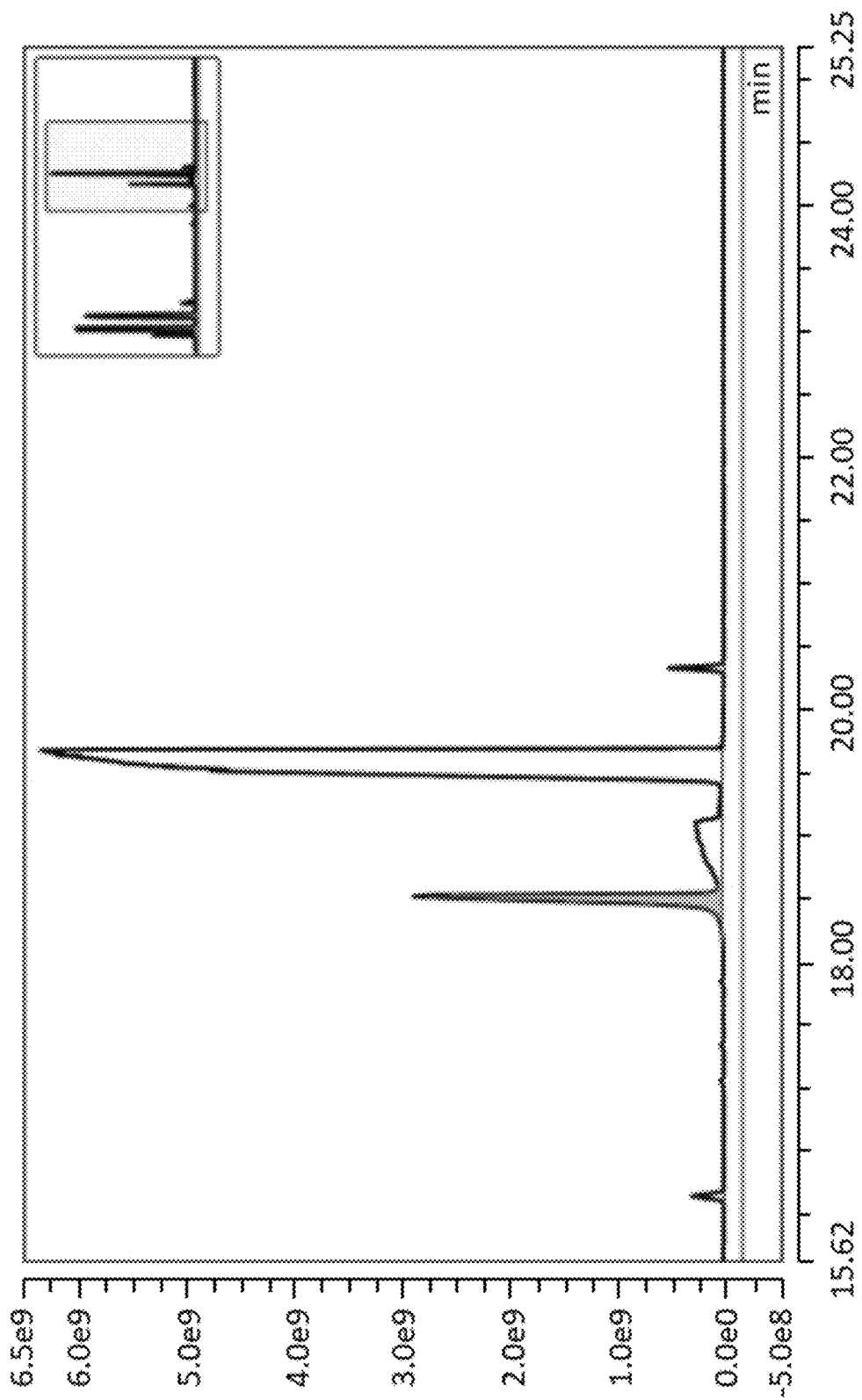
FIG. 2 depicts the GC-MS analysis of the crude product from Example 4 showing formation of the desired product—diethylaminotriiodosilane.
Figure 3:
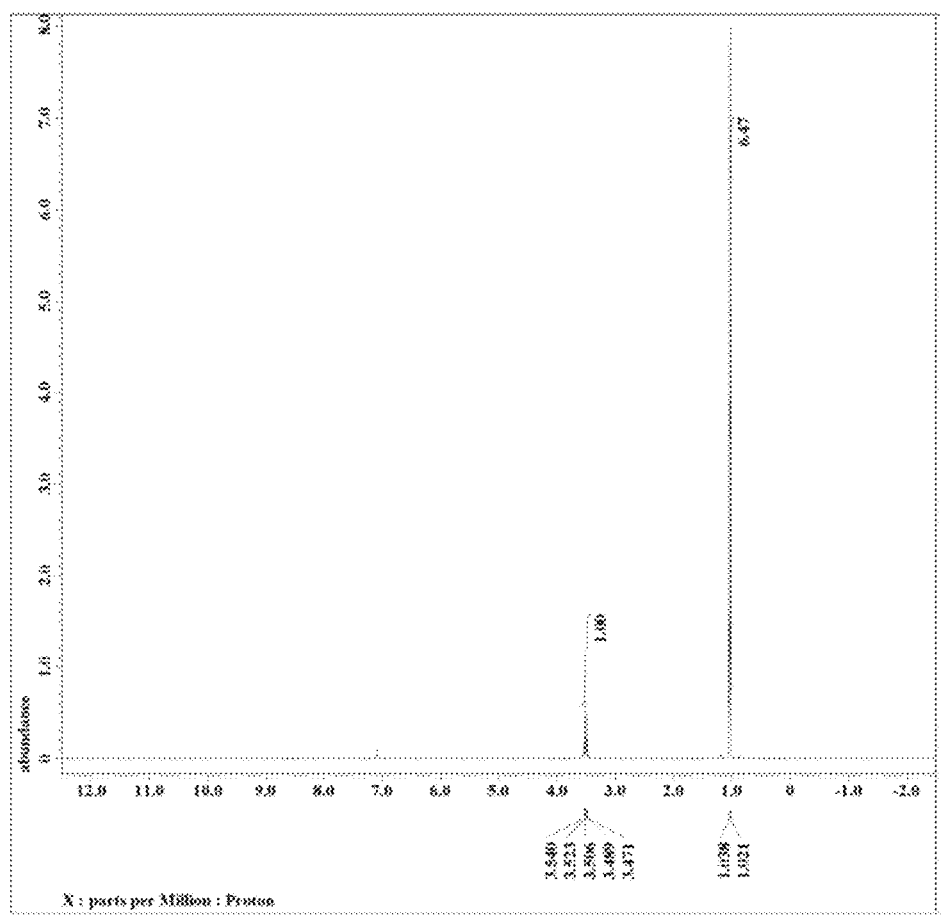
FIG. 3 is a $^1$H NMR analysis of the reaction mixture from Example 5 showing the formation of diisopropylaminotriiodosilane and complete conversion of diisopropylamine.

A 250 mL three neck round bottom flask equipped with a mechanical stirrer, a thermocouple and a rubber septum was charged with a solution of SiI4 (10 g, 18.6 mmol) in toluene (50 mL). The solution was cooled to ~0° C. using an ice-bath. A solution of diethylamine (5.5 g, 74.4 mmol) in toluene (50 mL) was added dropwise to the chilled solution at 0-2° C. using a liquid addition funnel. An immediate reaction takes place resulting in a thick white precipitate. The reaction is fairly exothermic and the temperature of the reaction mixture was maintained under 10° C. by adjusting the rate of addition of amine solution. The mixture was allowed to stir for additional 30 mins followed by filtration through a fritted funnel. The volatiles were removed under reduced pressure. The resulting viscous oil was subjected to NMR and GC analysis. The GC analysis shows formation of diethylaminotriiodosilane. (See FIG. 2)

Example 5—Synthesis of $(i\text{-}Pr_2N)SiI_3$

Second batch of triiodosilyl diisopropylamine$(iPr_2N)SiI_3$ with 41 g $SiI_4$ in toluene (400 mL). Diisopropylamine (15.4 g) added neat to the pink $SiI_4$ solution all at once. The color immediately changed to yellow and slowly became colorless. The reaction mixture turned cloudy but no significant exotherm was observed. Allowing the reaction mixture to stir at room temperature under nitrogen. The reaction was monitored by 1H NMR and 95% of free DIPA was consumed in 3 days at RT. Yield 28 g (72%). Purity by 1HNMR >98%

Example 6 Synthesis of $(N(CH_3)_2)_2SiI_2$ and $(N(CH_3)_2)SiI_3$ $SiI_4$ (100 g) was dissolved in toluene (1000 mL). To the resulting pink solution lithium dimethylamide (20 g) was added slowly. The reaction mixture turned slightly yellow and then to colorless. The temperature of the mixture raised to ~40° C. At this point the reaction mixture was allowed to stir overnight at RT.

The reaction mixture was filtered through a fritted funnel followed by removing volatiles under reduced pressure at 50° C. The light yellow viscous oil was purified by short path distillation resulting in clear colorless oil. The remaining yellow oil residue was diluted with hexane and kept in freezer. Isolated: clear oil, ~75-80% pure by $^1$H and $^{29}$Si NMR.

The invention has been described in detail with particular reference to preferred embodiments thereof, but it will be understood that variations and modifications can be effected within the spirit and scope of the invention.

The invention claimed is:

1. A compound of Formula (I)

(R₂N)SiI₃,  (I)

wherein each R is taken together with the nitrogen atom to which they are bonded to form a substituted or unsubstituted 3 or 4-membered N-heterocyclic ring.

2. The compounds of claim 1, wherein the compounds of Formula (I) are chosen from compounds of the formulae

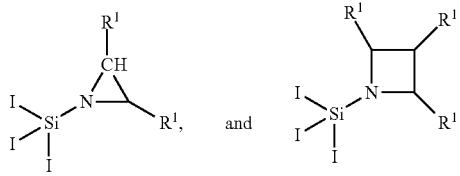

wherein each R¹ substituent is the same or different and is chosen from hydrogen, $C_1$-$C_{10}$ alkyl, $C_3$-$C_8$ cycloalkyl, aryl, or heteroaryl.

3. The compounds of claim 2, wherein each R¹ is hydrogen.

4. A process for preparing a compound of Formula (I)

(R₂N)SiI₃,  (I)

wherein each R is taken together with the nitrogen atom to which they are bonded to form a substituted or unsubstituted 3 or 4-membered N-heterocyclic ring, which comprises contacting a molar excess of a compound of the formula R₂N with a tetrahalosilane.

5. The process of claim 4, wherein at least one the tetrahalosilane and the compound of the Formula (I) is dissolved in a solvent.

6. The process of claim 5, wherein the solvent is an aromatic hydrocarbon.

7. The process of claim 4, wherein the tetrahalosilane is tetraiodosilane.

8. The process of claim 4, wherein the molar ratio of the tetrahalosilane to the compound of the formula R₂N is about 1:2.

9. The process of claim 4, wherein the compounds of Formula (I) are chosen from compounds of the formulae

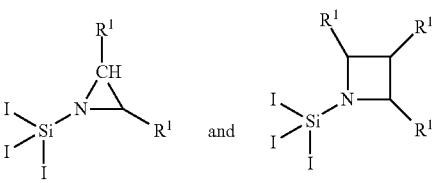

wherein each R¹ substituent is the same or different and is chosen from hydrogen, $C_1$-$C_{10}$ alkyl, $C_3$-$C_8$ cycloalkyl, aryl, or heteroaryl.

10. A process for depositing silicon-containing film on a microelectronic device substrate, which comprises contacting said substrate with a sequentially pulsed compound of Formula (I):

(R₂N)SiI₃,  (I)

wherein each R is taken together with the nitrogen atom to which they are bonded to form a substituted 3 or 4 membered N-heterocyclic ring;

and optionally any desired co-reactants, at a temperature of about 150° C. to about 700° C., and at a pressure of about 0.5 to about 50 Torr, under atomic layer deposition conditions.

11. The process of claim 10, wherein the compounds of Formula (I) are chosen from compounds of the formulae

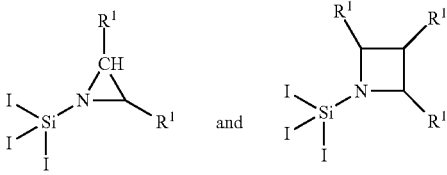

wherein each R¹ substituent is the same or different and is chosen from hydrogen, $C_1$-$C_{10}$ alkyl, $C_3$-$C_8$ cycloalkyl, aryl, or heteroaryl.

12. The process of claim 10, wherein the co-reactants are chosen from $N_2$, $H_2$, $NH_3$, $N_2H_4$, $CH_3HNNH_2$, $CH_3HNNHCH_3$, $NCH_3H_2$, $NCH_3CH_2H_2$, $N(CH_3)_2H$, $N(CH_3CH_2)_2H$, $N(CH_3)_3$, $N(CH_3CH_2)_3$, $(Si(CH_3)_2NH)$, pyrazoline, pyridine, diamines, $O_2$, $O_3$, $H_2O$, $H_2O_2$, NO, $N_2O$, $NO_2$, carboxylic acids, alcohols, diols, and radicals thereof, and combinations thereof.

\* \* \* \* \*